(12) United States Patent
Grimm

(10) Patent No.: US 10,970,154 B2
(45) Date of Patent: Apr. 6, 2021

(54) METHOD FOR DETECTING A FAILURE IN AN ELECTRONIC SYSTEM

(71) Applicant: Melexis Technologies NV, Tessenderlo (BE)

(72) Inventor: Heiko Grimm, Waltershausen (DE)

(73) Assignee: MELEXIS TECHNOLOGIES NV, Tessenderlo (BE)

(*) Notice: Subject to any disclaimer, the term of this patent is extended or adjusted under 35 U.S.C. 154(b) by 100 days.

(21) Appl. No.: 16/356,459

(22) Filed: Mar. 18, 2019

(65) Prior Publication Data

US 2019/0286507 A1 Sep. 19, 2019

(30) Foreign Application Priority Data

Mar. 19, 2018 (EP) .................................. 18162515

(51) Int. Cl.
*G06F 11/07* (2006.01)
*G01R 31/28* (2006.01)
(Continued)

(52) U.S. Cl.
CPC ........ *G06F 11/079* (2013.01); *G01R 31/2829* (2013.01); *G06F 11/0745* (2013.01);
(Continued)

(58) Field of Classification Search
CPC ............. G06F 11/0745; G06F 11/0751; G06F 11/079; G01R 31/2829
See application file for complete search history.

(56) References Cited

U.S. PATENT DOCUMENTS

2002/0152419 A1* 10/2002 McLoughlin ......... G06F 11/165
714/11
2011/0099439 A1* 4/2011 Brewerton .......... G06F 11/3604
714/724
(Continued)

FOREIGN PATENT DOCUMENTS

CN 102088424 A 6/2011
CN 206002638 U 3/2017
(Continued)

OTHER PUBLICATIONS

European Search Report from EP Application No. 18162515.3, dated Oct. 10, 2018.
(Continued)

*Primary Examiner* — Bryce P Bonzo
*Assistant Examiner* — Michael Xu
(74) *Attorney, Agent, or Firm* — Workman Nydegger

(57) ABSTRACT

A method for detecting a failure in an electronic signal processing system having a signal processing path comprises a configurable functional unit for performing a given function and at least one redundant version of the signal processing path including a corresponding configurable functional unit for performing the given function and configuring a first operating point for the functional unit in the signal processing path for performing the given function and configuring a second operating point for the corresponding functional unit in the redundant version of the signal processing path. The second operating point is different from the first operating point. The method further comprises applying a same input signal to the functional unit and the corresponding functional unit, comparing a first output signal produced by the functional unit with a second output signal produced by the corresponding functional unit, and deriving a failure indication from the comparing.

14 Claims, 6 Drawing Sheets

(51) Int. Cl.
*G07C 5/08* (2006.01)
*G06F 11/16* (2006.01)

(52) U.S. Cl.
CPC ...... *G06F 11/0751* (2013.01); *G06F 11/1629* (2013.01); *G07C 5/0808* (2013.01); *G07C 5/0816* (2013.01)

(56) References Cited

U.S. PATENT DOCUMENTS

| | | | | |
|---|---|---|---|---|
| 2012/0023389 | A1* | 1/2012 | Brewerton | G06F 11/1679 714/820 |
| 2012/0194469 | A1* | 8/2012 | Wang | G06F 3/044 345/174 |
| 2015/0227161 | A1* | 8/2015 | Kakunda | G06F 11/181 713/502 |
| 2016/0365213 | A1* | 12/2016 | Zettler | G01T 1/00 |
| 2017/0212635 | A1* | 7/2017 | Cordeiro | G06F 3/0446 |
| 2017/0228279 | A1* | 8/2017 | Mariani | G06F 11/008 |
| 2019/0332566 | A1* | 10/2019 | Yasunaka | H04L 25/0272 |

FOREIGN PATENT DOCUMENTS

| | | |
|---|---|---|
| DE | 102006011138 A1 | 7/2007 |
| DE | 102007034331 A1 | 1/2009 |

OTHER PUBLICATIONS

Office Action from corresponding CN Application No. 201910202576.9, dated Jun. 18, 2020.

\* cited by examiner

METHOD FOR DETECTING A FAILURE IN AN ELECTRONIC SYSTEM

FIELD OF THE INVENTION

The present invention is generally related to the field of techniques for detecting common cause failures as encountered in electronic systems comprising redundant circuitry.

BACKGROUND OF THE INVENTION

The use of electronic systems in safety critical environments, e.g. in automotive applications, requires a reliable operation of such electronic systems in order to avoid risks for persons depending on the operation of the electronic systems.

Consider as an example an electronic circuit with a safety level requirement, e.g. an ASIL requirement (where ASIL stands for Automotive Safety Integrity Level) a risk classification scheme defined by the ISO 26262—Functional Safety for Road Vehicles standard. The term 'functional safety' is in ISO 26262 defined as "absence of unreasonable risk due to hazards caused by malfunctioning behaviour of electrical or electronical systems". Such an electronic circuit requires measures to minimize or prevent the risk of safety goal violations in case of e.g. Single Point Failures, i.e. failures due to which the entire circuit stops working or provides faulty information to other subunits so that a subsystem or a complete system gets out of order.

One measure to minimize the risk of the safety goal violation is the implementation of redundant functional units (e.g. redundant signal processing blocks). In terms of development effort such measure is advantageous, because a single developed functional unit (e.g. circuit block and layout) is simply implemented multiple times in the system.

By applying an identical input signal to the redundant functional units and comparing the output signals of the units a malfunction can be deduced if an output signal inequality exceeds a predefined limit.

FIG. 1 gives an example of a redundant signal processing chain as known in the prior art. The circuit in FIG. 1 comprises a processing chain with a functional block FIJI containing in this example three signal processing units (e.g. an amplifier, comparator, ADC) and a redundant processing chain with a corresponding three-chain functional block FU2. Differential signal processing is applied in FIG. 1. Consequently, a common mode reference signal (common mode voltage VCM, i.e. centre-voltage level of the differential voltage signal) is required. This voltage VCM defines for instance the operational point (working point) of a given signal processing unit. Depending on the circuit topology each type of signal processing unit (SPU) in the signal processing chain may require a separate VCM (e.g. VCM1 for SPU1.1, VCM2 for SPU1.2, VCM3 for SPU1.3), but VCMs of several SPUs or each SPU-type may obviously also be identical (e.g. VCM1=VCM2=VCM3 or VCM1=VCM2< >VCM3). The same holds for the redundant signal processing chain, wherein the same VCM1, VCM2 and VCM3 are applied. A system failure indication unit (FISY) can then identify relevant single point failures in all SPUs present in the scheme by comparing output signal 1 and output signal 2.

A remaining risk of that type of redundant systems and that way of detecting are common cause failures. Common cause failures impact the redundant functional units in a similar manner (e.g. caused by manufacturing process insufficiency or critical environmental conditions like electromagnetic compatibility (EMC) disturbances, electrostatic discharge (ESD) disturbances or conditions wherein specified temperature limits are exceeded). The impact on the output signals can also be similar and in that case the failure detection by comparing the output signals may be impossible.

Application US2016/365213 is concerned with failures (referred to as dependent failures) which may lead to simultaneous malfunction or failure of two redundant circuits. It provides a solution to facilitate the detection of a disturbance parameter being outside a predetermined range. Such disturbance parameter may for example cause dependent failures in redundant circuits, for example redundant circuits being arranged on a same substrate. The disturbance parameter is detected by means of a sensing element sensitive to the disturbance parameter. This sensing element and the related circuitry might also involve a higher cost.

Thus, there is a need for a method for detecting a failure, in particular a common cause failure, in an electronic system wherein the need for a device to measure a disturbance is avoided.

SUMMARY OF THE INVENTION

It is an object of embodiments of the present invention to provide for a reduction of the risk of failures, in particular common cause failures, in an electronic processing system.

The above objective is accomplished by the solution according to the present invention.

In a first aspect the invention relates to a method for detecting a failure in an electronic signal processing system having a signal processing path comprising a configurable functional unit for performing a given function and at least one redundant version of said signal processing path comprising a corresponding configurable functional unit for performing said given function, the method comprising
  configuring a first operating point for the functional unit in said signal processing path for performing the given function,
  configuring a second operating point for the corresponding functional unit in the redundant version of the signal processing path, said second operating point being different from said first operating point while allowing performing the given function
  applying a same input signal to the functional unit and the corresponding functional unit,
  comparing a first output signal produced by the functional unit with a second output signal produced by the corresponding functional unit,
  deriving a failure indication from said comparing.

The proposed solution indeed allows for reducing the risk of common cause failures as it yields an indication of a failure from a comparison of the output signals of the two redundant paths. The method imposes a difference in operating point between the two branches, which can next be exploited to determine a possible malfunction.

In a preferred embodiment at least one of the first and the second operating point is programmable. This allows the use of different levels for the operating points depending on the actual conditions. Advantageously, at least one of the first and the second operating point is adaptable at run time. Such a change may occur e.g. when a change in the external conditions wherein the signal processing system operates, is observed. The adaptation might for instance be done by a control unit at a higher level of the system.

In embodiments of the invention the failure indication is next further processed in the electronic signal processing system.

Preferably the comparing comprises making a difference between the first output signal and the second output signal and comparing that difference with a reference value. Again this reference value may be a programmable parameter. The reference value may also be set by a control unit at a higher level of the system. The reference value may also be the result of a calibration procedure.

In other embodiments the signal processing path comprises one or more further functional units preceding the functional unit producing the first output signal and the at least one redundant version of the signal processing path comprises one or more corresponding further functional units.

Advantageously, the input signal is a differential signal. The functional unit then preferably receives a first common mode signal and the corresponding functional unit receives a second common mode signal different from said first common mode signal.

In certain embodiments a comparison is performed on a positive input and a negative input of the differential signal applied to the functional unit. This provides an additional check. The comparison may then comprise summing the positive input and the negative input and comparing that sum with twice said first common mode signal. A similar method step can be adopted for the redundant path, whereby the second common mode signal is employed in the comparison.

In other embodiments the electronic signal processing system has, in addition to the 'main' signal processing path, two or more redundant versions of the signal processing path and the comparing output signals are pairwise compared. The failure indication may then be derived based on a majority decision on the pairwise comparisons. In these embodiments the signal processing system can keep on functioning as only the malfunctioning signal path may be switched off. An additional failure signal might be flagged.

In another embodiment one or more of the signal processing path and its redundant versions affected by the failure indication are taken out-of-service. An error information might be flagged.

Advantageously a programmable threshold can be set when performing the comparing steps in the proposed method to decide on a failure indication.

In another aspect the invention relates to an electronic signal processing system having a signal processing path comprising a configurable functional unit for performing a given function and at least one redundant version of said signal processing path comprising a corresponding configurable functional unit for performing said given function, and arranged for configuring a first operating point for said functional unit in said signal processing path and a second operating point for said corresponding functional unit in said redundant version of said signal processing path, said second operating point being different from said first operating point while allowing performing said given function, and further arranged for comparing a first output signal produced by said functional unit with a second output signal produced by said corresponding functional unit and for deriving a failure indication from said comparing.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
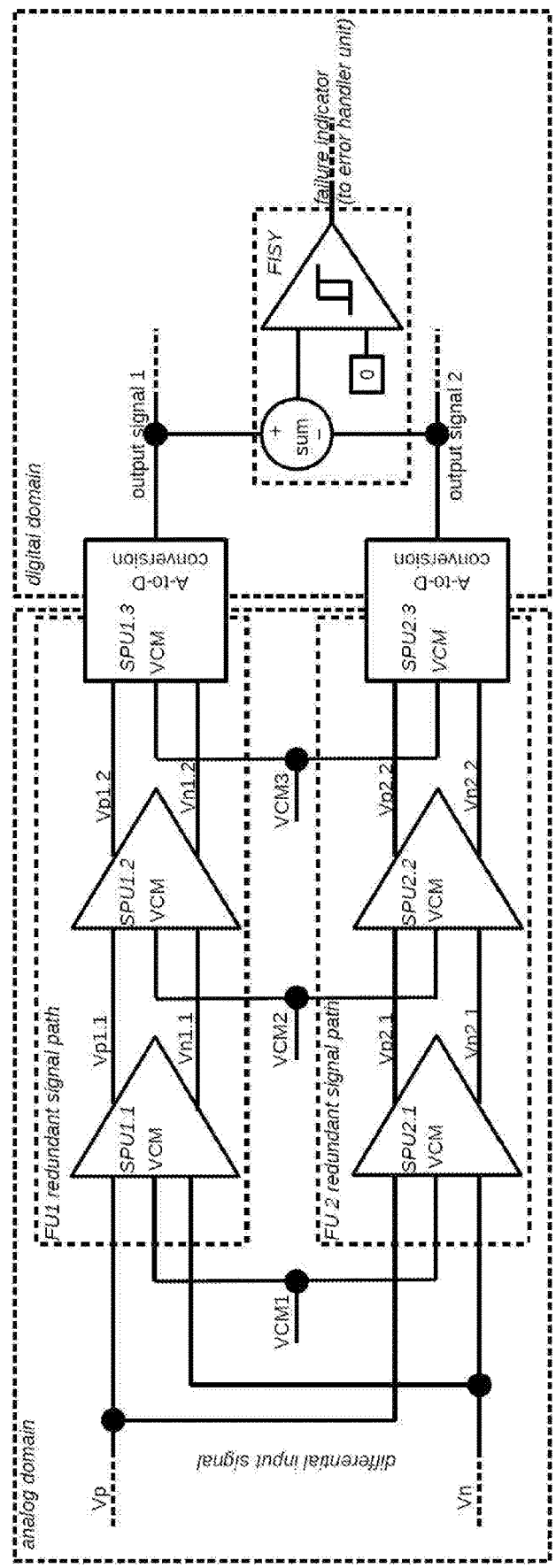
FIG. 1 illustrates a redundant signal processing scheme as known in the art.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention discloses a method to reduce the remaining risk of common cause failures in redundant system configurations with focus on electronic circuit topologies that require a working point, for example a DC operating point.

Figure 2:
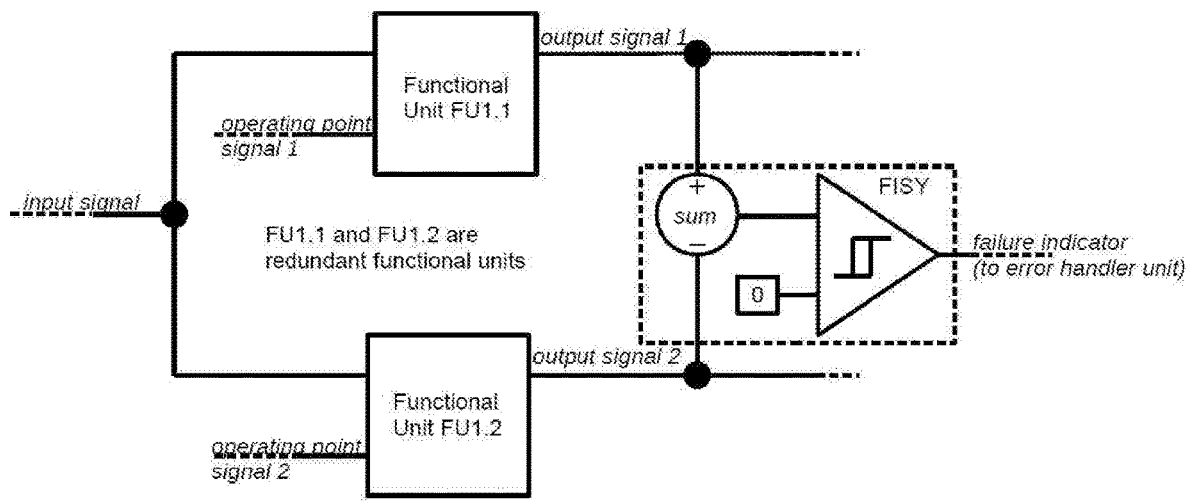
FIG. 2 illustrates a block scheme according to an embodiment of the present invention.

FIG. 2 provides a block scheme of a set-up considered in the present invention. A redundant signal processing system is depicted comprising in a first signal path a functional unit FU 1.1 and in a redundant signal processing path comprising a corresponding functional unit FU1.2. In such a corresponding functional unit basically the same building components can be found as in the first signal path. The functional units FU1.1 and FU1.2 are configurable. Typically they have a substantially identical system and circuit topology, component sizing and parametrization. Typically there can be minor differences in the circuit layout and the layout orientation of FU1.1 and FU1.2. For example, the two units may have been shifted, flipped, mirrored or have undergone any other kind of geometrical manipulation. Inevitably there is a difference in the layout location.

The functional unit FU1.1 is configured to work at an operating point 1 and the corresponding functional unit FU1.2 is configured to work at an operating point 2. The two operating points are substantially different, meaning that operating point 2 differs from operating point 1 by, for example, plus or minus 5% or +/−10% or +/−15% or more. The amount by which the two operating points are different may depend on the accuracy required in the envisaged application. The difference can in some embodiments be dependent on the full scale range. However, the fact that they have a different operating point, does not have a relevant impact on function and internal signal processing of blocks FU1.1 and FU2.1. The output signal 1 and output signal 2 are substantially identical in their AC behaviour when the same input signal is applied to the respective inputs of the functional units, even though the substantially identical circuits FU1.1 and FU1.2 have a significantly different internal operating point.

In preferred embodiments the setting of the operating points is made programmable in the manufacturing phase. The setting of an operating point may also follow from performing a calibration. Referring to FIG. 2, during such a calibration step an input signal is for instance provided and both output signals 1 and 2 are measured. Two operating point signals 1 and 2 are provided e.g. in such a way, that the output signals 1 and 2 differ to achieve a maximum allowed or a minimally needed voltage difference in order to be sensitive to one or more common cause failures, e.g. in order to be robust to a certain EMC level. The two operating point signals 1 and 2 might be provided for instance through a DAC (Digital to Analog Converter) or by a digitally controllable voltage source or a digitally controllable current source. The digital control information provided for the operating point signals 1 and 2 may then be stored in a memory device during the calibration step in order to be used during application.

The electronic processing system may comprise a higher level control unit that takes care of setting the operating points. It is further advantageous that the operating points can be adjusted at run time, i.e. while the electronic signal processing system is in operation. This allows adapting the operating points to the actual conditions under which the processing system is working. The adaptation may for instance be done in a similar way as above described for the calibration.

In another embodiment different settings for the operating point 1 and operating point 2 for different operating conditions (e.g. temperature or noise level or EMC level) are memorized. The higher level control unit may be arranged to select a given setting depending on the operation condition.

The two output signals are then compared in a system failure indication unit. In the embodiment of FIG. 2 this unit (FISY) is implemented with subtraction means for determining a difference between the two output signals and a comparator block wherein that difference is compared with an input reference signal (in this example a constant value 0). The skilled person readily sees that other implementations can be envisaged. If the FU1.1 and FU1.2 output signals are significantly different, an error condition predominates. The comparator block outputs a failure indication signal that typically is processed by the system error handler. If this signal becomes active then typically a procedure to enter a safe state is initiated.

Figure 3:
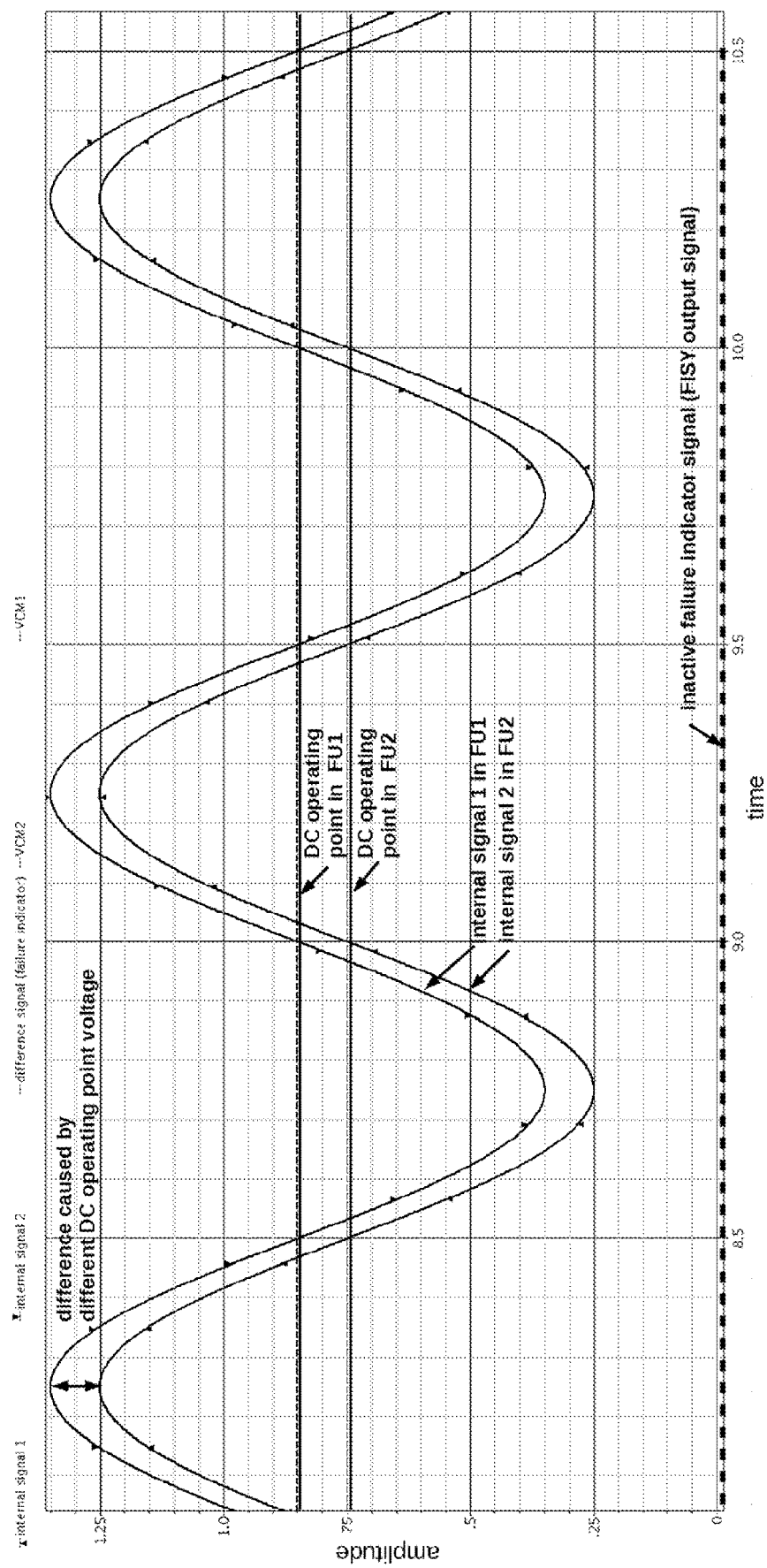
FIG. 3 illustrates some internal signals of the functional unit in case there is no failure condition present.

FIG. 3 illustrates signals internal in the functional unit with different DC operating points and corresponding output signal of the failure indication unit in the absence of failure conditions. It shows a typical signal representation in signal processing chains FU1 and FU2 ofFIG. 2. Different DC operating points are set in signal processing chains FU1 and FU2. Because the wanted signal is not affected by one or more internal or external failure initiators, the system failure indicator output signal is inactive.

Figure 4:
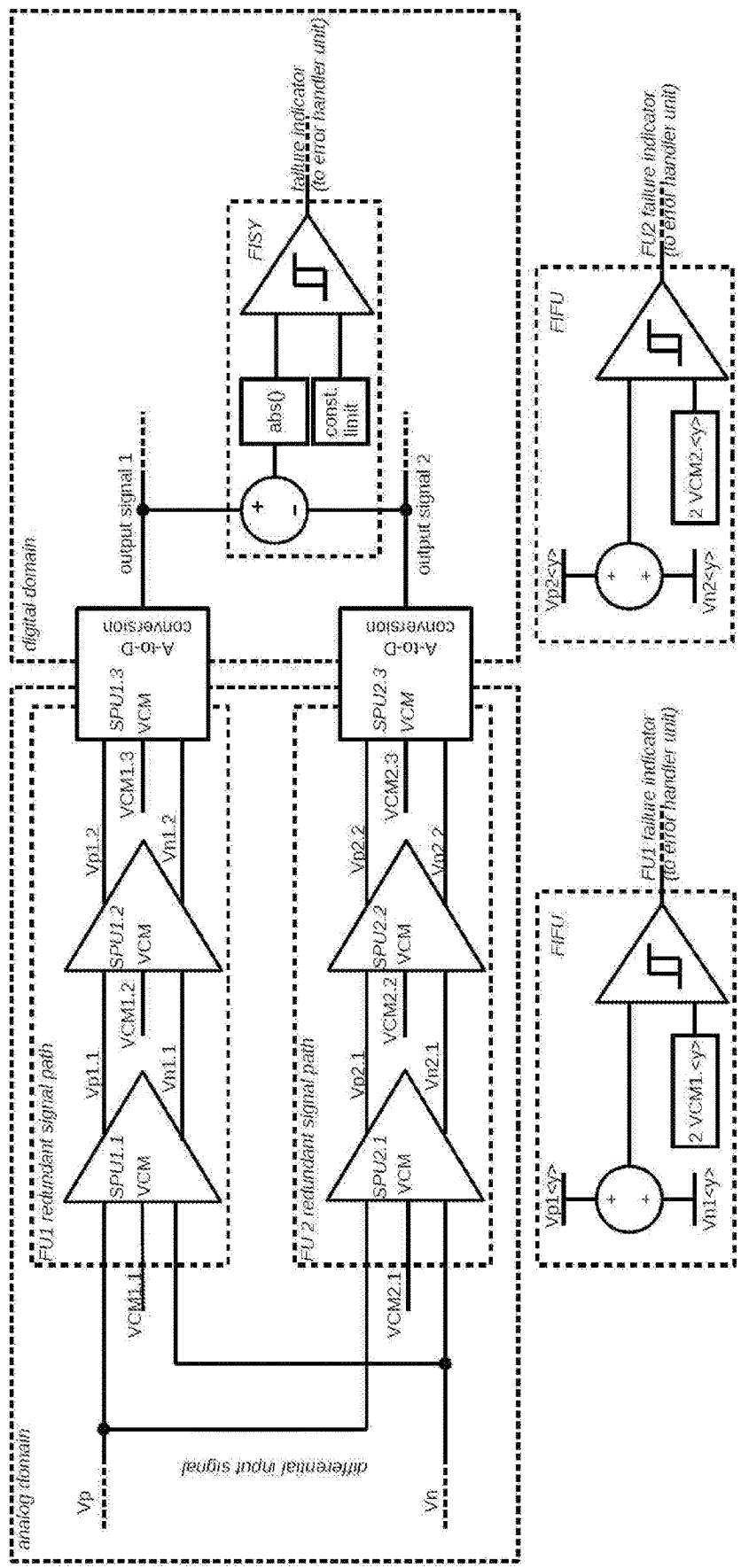
FIG. 4 illustrates a block scheme according to an embodiment of the present invention. Additional failure indication blocks for checking the common mode signals are shown as well.

FIG. 4 illustrates a circuit according to an embodiment of the invention with a redundant signal processing chain with reduced common cause failure risk. The main difference with the prior art scheme of FIG. 1 is that separate operating points VCMx. 1, VCMx.2 and VCMx.3 are introduced, with x=1 or 2. In other words, the redundant SPUs SPU1.1 and SPU2.1, for example, operate at a different VCM level. In the failure indication unit 'output signal 1' and 'output signal 2' are further processed. In the embodiment of FIG. 4 they are simply subtracted. The subtraction result without predominating failure is ideally zero. The subtraction result with predominating failure is different from zero. In this example a comparison of the subtraction result with a constant limit value, e.g. a given threshold value, is used to generate the failure indication signal. An error might be flagged, if the subtraction result is bigger than the given threshold.

In embodiments the threshold and/or the different operating points are kept programmable. The programming might be done when manufacturing the integrated circuit. Alternatively, it might be done by means of a memory element (for instance an EEPROM) at an end of line programming step during a calibration of the integrated circuit. In yet other embodiments the threshold and/or the different operating points might be set via a communication or bus protocol by a higher-level system device.

The advantage of providing this programmability is that it makes the unit adjustable to different use conditions. In a hard EMC environment other use conditions are present compared to an environment, in which temperature as a common mode failure might play a role.

Further, in the embodiment of FIG. 4 additional failure indication units (called FIFU in the figure) are introduced to verify the integrity of the common mode signal in each signal processing path by monitoring the differential signal. The failure indication unit adds the complementary differential signal components $V_p{<}x.y{>}$ and $V_n{<}x.y{>}$. As result the wanted signal is suppressed and 2 $VCM{<}x.y{>}$ is the remaining signal. The remaining signal 2 $VCM{<}x.y{>}$ can be monitored for instance by a window comparator.

Figure 5:
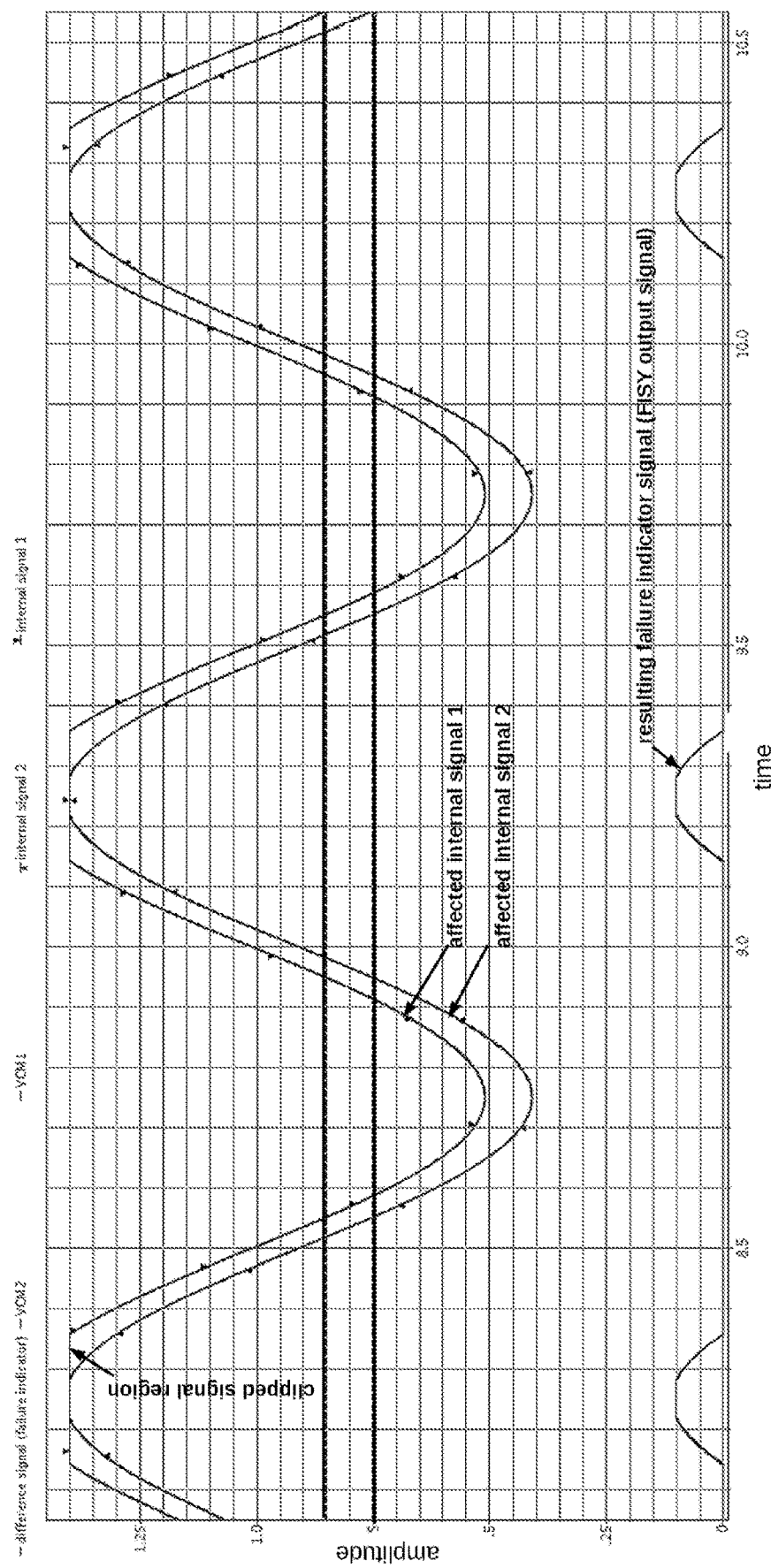
FIG. 5 illustrates some internal signals of the functional unit in case of a failure condition.

FIG. 5 illustrates signals internal in the functional unit with different DC operating points and corresponding output signal of the failure indication unit in case a predominant failure occurs. FIG. 5 shows a typical signal representation in signal processing chains FU1 and FU2 of FIG. 4. There are different DC operating points set in both signal processing chains FU1 and FU2. The wanted signal is affected by one or more internal or external failure initiators. Because of shifted DC operating points and the presence of a common mode failure, the signals in the two signal chains may be clipped in a different manner. Signal 1 might only be clipped, Signal 2 might only be clipped or both signals are clipped. Because the amount of signal clipping in redundant signal processing chain is different, the FISY can identify the failure and the system failure indicator output signal is active.

Figure 6:
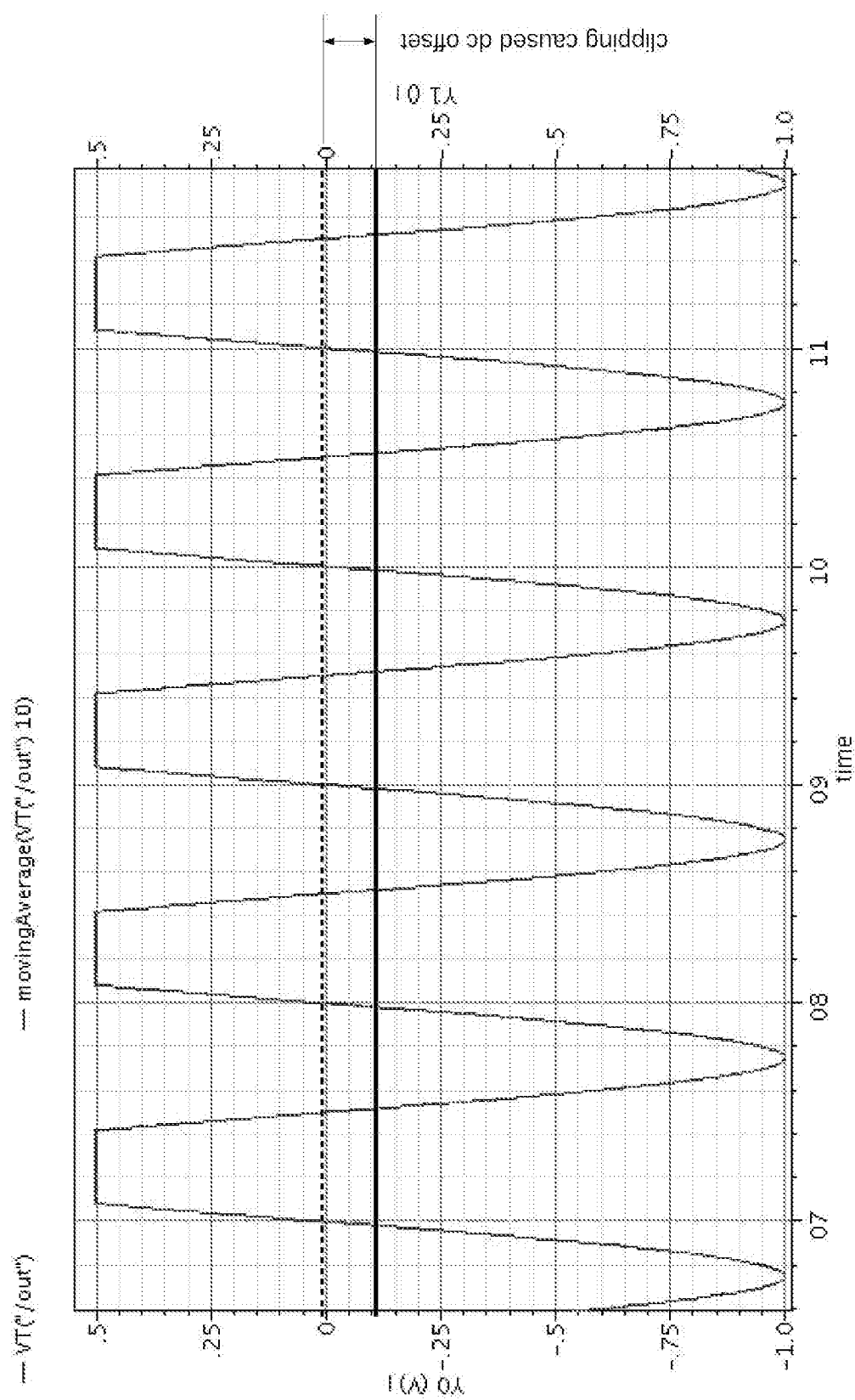
FIG. 6 illustrates a potential failure effect that could result in a common cause failure.

FIG. 6 shows a typical example of an unwanted signal manipulation. By a DC operating point shift a single side overdrive of the signal processing unit by a sinusoidal signal typically results in signal clipping. The clipping of the sinusoidal signal (Y0) causes the introduction of a DC signal component. The average (Y1) of the clipped sinusoidal signal visualizes the introduced DC component. This kind of signal manipulation can cause a safety goal violation in safety critical applications. The failure indication unit in a redundant system can usually not identify this kind of failures because signal processing in all functional units can be similarly affected. The compare stage in the failure indication unit suppresses the DC component, so it is not possible to identify the failure.

Common cause failures can be initiated in various ways. For example, a manipulated wanted signal or an injected unwanted signal may cause signal offset. Signal distortion can be caused by unwanted environmental impact (e.g. radio frequency injection, temperature variation caused drift, mechanical stress caused drift, supply value quantity variation). A wanted signal may be distorted, e.g. a clipped sinusoidal signal as depicted in FIG. 5. The cause may also be an unwanted signal, e.g. an unwanted injected RF signal (EMI) or unwanted superimposed input signal (LF signal, pulses, leakage caused DC signal or, in case of sensor system, any physical quantity that causes shift in the value to be sensed. The common cause failure may then originate from, for example, a DC offset caused by clipping that cannot be identified but can have relevant impact on the wanted signal (e.g. a relevant output signal deviation resulting in safety goal violation. Such a failure can typically not be detected by designing a redundant system based on identical functional units and failure indication units because the outputs of the redundant units face are affected by the same failure signal.

In further embodiments the electronic signal processing system comprises at least three channels, i.e. a first signal processing path and at least two redundant paths, which each are provided with a redundant version of that first signal processing path. In such a system each signal path has its own operating point, different from the operating points in the other paths. Each signal path yields an output signal. The output signals are then compared to obtain an indication of whether or not there is a failure. This comparison is preferably done on a pair-by-pair basis. The decision on a failure being present or not can be taken by majority. Suppose for example there are three channels and two of the three output signal comparisons indicate there is indeed an error but the third comparison result does not indicate an error, then it can be decided that there is indeed a failure. Optionally this error can be flagged.

From the various comparisons it is possible to identify the channel where the failure occurs. It may then be decided not to use this channel (i.e. signal processing path) anymore. The remaining channels may still be kept in use.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method for detecting a failure in an electronic signal processing system having a signal processing path comprising a configurable functional unit for performing a given function and at least one redundant version of said signal processing path comprising a corresponding configurable functional unit for performing said given function, the method comprising:
configuring a first operating point for said functional unit in said signal processing path for performing said given function,
configuring a second operating point for said corresponding functional unit in said redundant version of said signal processing path, said second operating point being different from said first operating point while allowing performing said given function,
applying a same input signal to said functional unit and said corresponding functional unit,
comparing a first output signal produced by said functional unit with a second output signal produced by said corresponding functional unit,
deriving a failure indication from said comparing.

2. The method for detecting a failure as in claim 1, wherein at least one of said first and said second operating point is programmable.

3. The method for detecting a failure as in claim 1, wherein at least one of said first and said second operating point is adaptable at run time.

4. The method for detecting a failure as in claim 1, wherein said failure indication is further processed in said electronic signal processing system.

5. The method for detecting a failure as in claim 1, wherein said comparing comprises making a difference between said first output signal and said second output signal and comparing said difference with a reference value.

6. The method for detecting a failure as in claim 1, wherein said signal processing path comprises one or more further functional units preceding said functional unit producing said first output signal and
wherein said at least one redundant version of said signal processing path comprises one or more corresponding further functional units.

7. The method for detecting a failure as in claim 1, wherein said input signal is a differential signal.

8. The method for detecting a failure as in claim 7, wherein said functional unit receives a first common mode signal and said corresponding functional unit receives a second common mode signal different from said first common mode signal.

9. The method for detecting a failure as in claim 7, wherein a comparison is performed on a positive input and a negative input of said differential signal applied to said functional unit.

10. The method for detecting a failure as in claim 9, wherein said comparison comprises summing said positive input and said negative input and comparing that sum with twice said first common mode signal.

11. The method for detecting a failure as in claim 1, wherein said electronic signal processing system has two or more redundant versions of said signal processing path and
wherein in said comparing output signals are pairwise compared.

12. The method for detecting a failure as in claim 11, wherein said failure indication is derived based on a majority decision on the pairwise comparisons.

13. The method for detecting a failure as in claim 1, wherein one or more of said signal processing path and its redundant versions affected by said failure indication are taken out-of-service.

14. An electronic signal processing system having a signal processing path comprising a configurable functional unit for performing a given function and at least one redundant version of said signal processing path comprising a corresponding configurable functional unit for performing said given function, and arranged for configuring a first operating point for said functional unit in said signal processing path and a second operating point for said corresponding functional unit in said redundant version of said signal processing path, said second operating point being different from said first operating point while allowing performing said given function, and further arranged for comparing a first output signal produced by said functional unit with a second output signal produced by said corresponding functional unit and for deriving a failure indication from said comparing.

* * * * *